United States Patent
Tsunoda

[19]

[11] Patent Number: 5,982,026
[45] Date of Patent: Nov. 9, 1999

[54] INEXPENSIVE RESIN MOLDED SEMICONDUCTOR DEVICE

[75] Inventor: Youichi Tsunoda, Kumamoto, Japan

[73] Assignee: NEC Corporation, Tokyo, Japan

[21] Appl. No.: 08/895,202

[22] Filed: Jul. 16, 1997

[30] Foreign Application Priority Data

Jul. 16, 1996 [JP] Japan .................................. 8-185839

[51] Int. Cl.⁶ .............................................. H01L 23/495
[52] U.S. Cl. ......................... 257/666; 257/738; 257/697
[58] Field of Search ................................... 257/676, 738, 257/780, 666, 673, 697

[56] References Cited

U.S. PATENT DOCUMENTS

| | | | |
|---|---|---|---|
| 5,045,921 | 9/1991 | Lin et al. ............................... | 257/780 |
| 5,293,072 | 3/1994 | Tsuji et al. ............................ | 257/738 |
| 5,317,188 | 5/1994 | Kondou ................................. | 257/668 |
| 5,389,739 | 2/1995 | Mills ..................................... | 257/666 |
| 5,663,593 | 9/1997 | Mostafazadeh et al. ............... | 257/676 |
| 5,663,594 | 9/1997 | Kimura .................................. | 257/738 |
| 5,668,405 | 9/1997 | Yamashita ............................. | 257/738 |
| 5,677,566 | 10/1997 | King et al. ............................ | 257/738 |
| 5,717,252 | 2/1998 | Nakashima et al. .................. | 257/738 |
| 5,729,051 | 3/1998 | Nakamura ............................. | 257/738 |

FOREIGN PATENT DOCUMENTS

| | | |
|---|---|---|
| 63-190370 | 8/1988 | Japan . |
| 8-139259 | 5/1996 | Japan . |

*Primary Examiner*—Nathan K. Kelley
*Attorney, Agent, or Firm*—Foley & Lardner

[57] ABSTRACT

In a resin molded semiconductor device, a metal lead frame includes an island and leads, and the leads have bulged terminal portions. Also, a semiconductor chip is mounted on the island, and external terminals are adhered to the bulged terminal portions opposite to the semiconductor chip. Further, an envelope of resin encapsulates the metal lead frame, the semiconductor chip and a part of each of the external terminals.

7 Claims, 10 Drawing Sheets

INEXPENSIVE RESIN MOLDED SEMICONDUCTOR DEVICE

BACKGROUND OF THE INVENTION

1. Field of the Invention

The present invention relates to a resin molded semiconductor device.

2. Description of the Related Art

In order to increase the packaging density, ball grid array (BGA) type packages (semiconductor devices) and pin grid array (PGA) type semiconductor devices have been developed.

In a prior art BAG or PGA type semiconductor device, a printed board is formed by an insulating substrate made of ceramic glass-epoxy. Also, a wiring pattern having terminal pads arranged in an array are formed by plating or the like on the insulating substrate. Also, a semiconductor chip is mounted on an island of the printed board. Also, bonding wire is bonded between the wiring pattern and bonding pads of the semiconductor chip. Further, the semiconductor chip and the bonding wire are hermetically sealed by a ceramic cap or resin-molded.

Also, in the BGA type device, external pins are inserted into throughholes perforated in the insulating substrate, and balls are soldered on the tips of the external pins. On the other hand, in the PGA type device, flanged pins are inserted into the throughholes of the insulating substrate.

The prior art BGA and PGA type semiconductor devices will be explained later in detail.

In the above-described prior art devices, however, since the printed board is made of ceramic or glass-epoxy and the wiring pattern is formed by plating, the manufacturing cost is increased. Particularly, if an additional ground line is required so that the insulating substrate is multilayered, the number of manufacturing steps is increased which further increases the manufacturing cost. In addition, if the devices are resin-molded, since there is a large difference in thermal expansion coefficient between the insulating substrate and epoxy resin, the insulating substrate is easily separated from the epoxy resin by the thermal expansion and shrinkage thereof, or cracks are easily generated in the epoxy regin. Thus, the prior art semiconductor devices are low in reliability.

SUMMARY OF THE INVENTION

It is an object of the present invention to provide an inexpensive and reliable resin molded semiconductor device.

According to the present invention, in a resin molded semiconductor device, a metal lead frame includes an island and leads, and the leads have bulged terminal portions. Also, a semiconductor chip is mounted on the island, and external terminals are adhered to the bulged terminal portions opposite to the semiconductor chip. Further, an envelope of resin encapsulates the metal lead frame, the semiconductor chip and a part of each of the external terminals.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor devices will be explained with reference to FIGS. 1, 2A, 2B, 3A and 3B.

Figure 1:
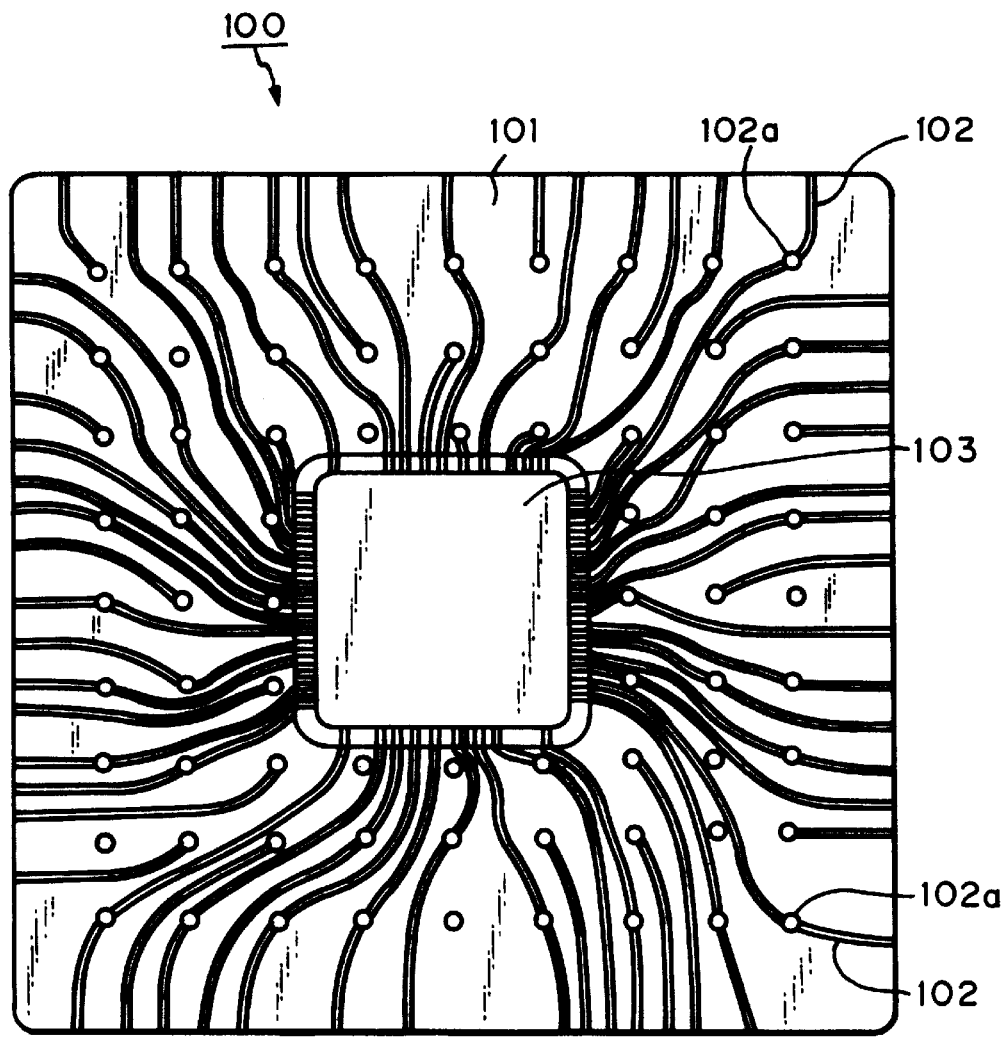
FIG. 1 is a plan view illustrating a printed board used in the prior art.

In FIG. 1, which is a plan view of a printed board used in the prior art semiconductor devices, a printed board 100 is formed by an insulating substrate 101 made of ceramic glass-epoxy. Also, a wiring pattern 102 having terminal pads 102a arranged in an array are formed by plating or the like on the insulating substrate 101. In this case, the wiring pattern 102 is made of Au—Ni or W—Cu. Further, an island 103 is formed in the insulating substrate 101 for mounting a semiconductor chip thereon. In addition, throughholes (not shown) are perforated in the insulating substrate 101 and reach the terminal pads 102a. Note that each of the insulating substrate 101 and the wiring pattern 102 can be made of a single layer or a multi-layer.

Figure 2A:
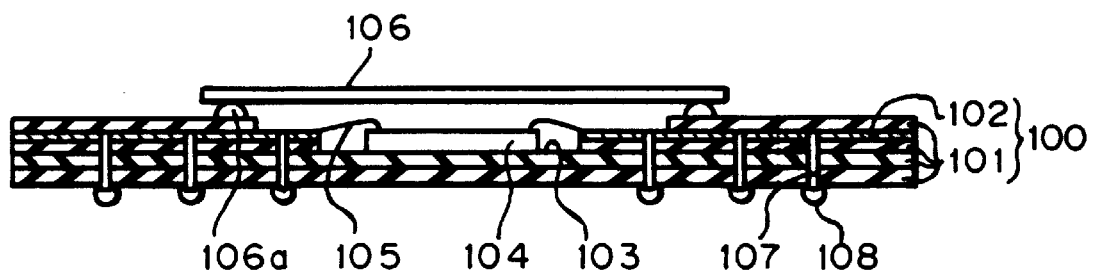
FIGS. 2A and 2B are cross-sectional diagrams illustrating first and second prior art BGA type semiconductor devices, respectively.

In FIG. 2A, which illustrates a first prior art BGA type semiconductor device using the printed board 100 of FIG. 1, a semiconductor chip 104 is mounted on the island 103 of the printed board 100. Also, bonding wire 105 is bonded between the wiring pattern 102 and bonding pads (not shown) of the semiconductor chip 104. Further, the semiconductor chip 104 and the bonding wire 105 are hermetically sealed by a ceramic cap 106 using a glass element 106a.

Also, external pins 107 are inserted into throughholes perforated in the insulating substrate 101, and balls 108 are soldered on the tips of the external pins 107.

Figure 2B:
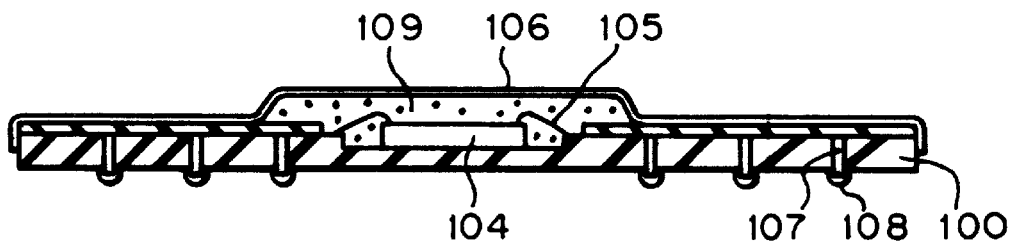

In FIG. 2B, which illustrates a second prior art BGA type semiconductor device, the semiconductor chip 104 and the bonding wire 105 of FIG. 2A are resin-molded by epoxy resin as indicated by 109. This BGA type semiconductor device is called an over molded pad array carrier (OMPAC) type semiconductor device.

Figure 3A:
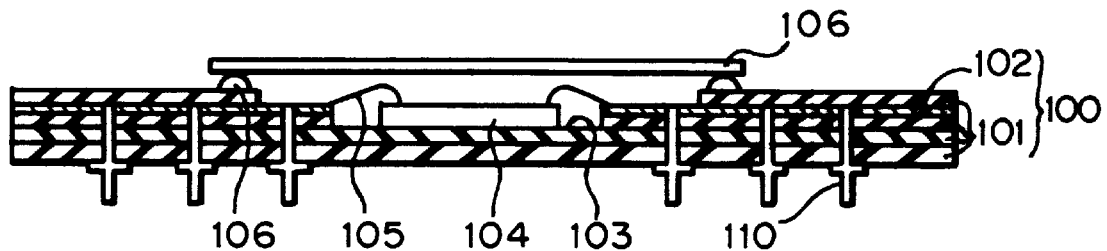
FIGS. 3A and 3B are cross-sectional diagrams illustrating first and second prior art PGA type semiconductor devices, respectively.

In FIG. 3A, which illustrates a first prior art PGA type semiconductor device, flanged pins 110 instead of the external pins 107 of FIG. 2A are inserted into the throughholes of the insulating substrate 101.

Figure 3B:
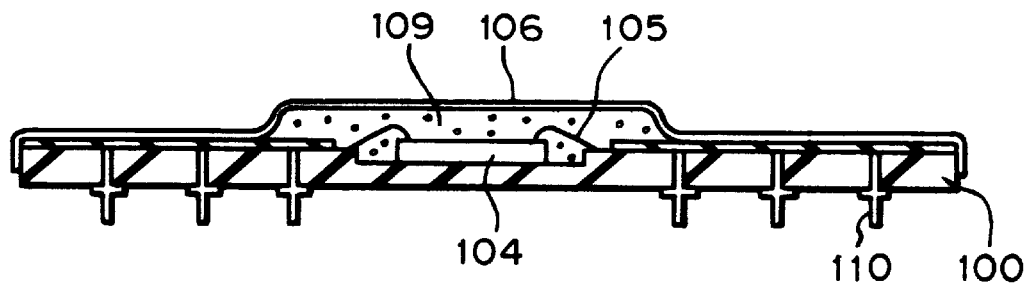

In FIG. 3B, which illustrates a second prior art PGA type semiconductor device, the semiconductor chip 104 and the bonding wire 105 of FIG. 3B are resin-molded by epoxy resin as indicated by 109.

In FIGS. 1, 2B, 2C, 3A and 3B, since the printed board 100 is made of ceramic or glass-epoxy which is expensive and the wiring pattern 102 is formed by plating, the manufacturing cost is increased. Particularly, if an additional ground line is required so that the insulating substrate 101 is multilayered, the number of manufacturing steps is increased to further increase the manufacturing cost.

Also, in FIGS. 1, 2B and 3B, since there is a large difference in thermal expansion coefficient between the insulating substrate 101 and the epoxy resin indicated by 109, the insulating substrate 101 is easily separated from the epoxy resin by the thermal expansion and shrinkage thereof, or cracks are easily generated in the epoxy regin. Thus, the semiconductor devices of FIGS. 1, 2B and 3B are low in reliability.

Figure 4:
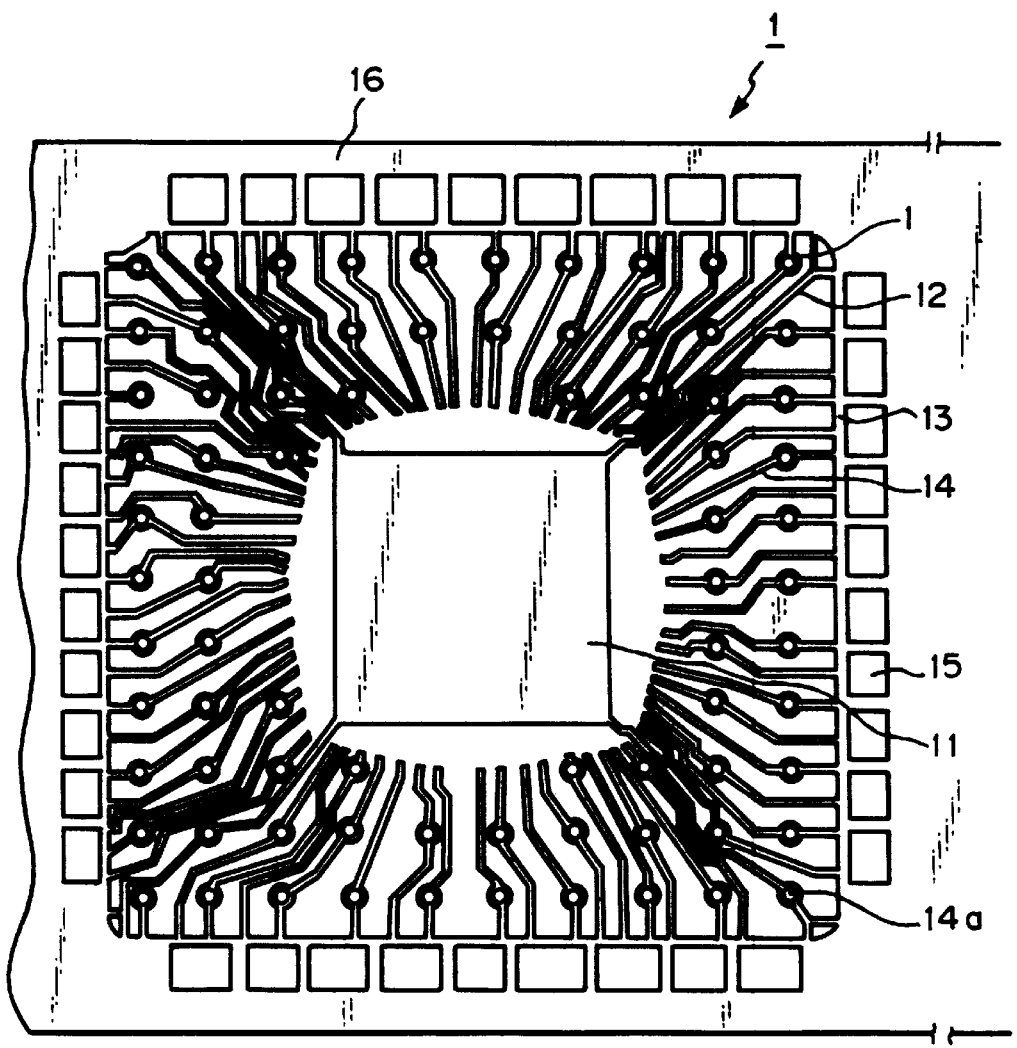
FIG. 4 is a plan view illustrating a lead frame according to the present invention.

In FIG. 4, which is a plan view illustrating a lead frame according to the present invention, a lead frame 1 is made of metal such as aluminum alloy or copper alloy. The lead frame 1 is formed by an island 11 for mounting a semiconductor chip, four suspenders 12 for supporting the island 11, tie bars 13 serving as resin leakage avoiding means, leads 14, slits 15 for relaxing the deformation of the lead frame 1, and a frame 16 for fixing the island 11, the suspenders 12, the tiebars 13, leads 14, and the semiconductor chip to each other after the resin molding of the semiconductor chip. Note that the slits 15 can be omitted.

Also, throughholes 14a are perforated in bulged terminal portions of the leads 14. The throughholes 14a are arranged in an array.

A first embodiment of the method for manufacturing a semiconductor device according to the present invention will be explained with reference to FIGS. 5A, 5B, 5C and 5D. Note that this semiconductor device is of a BGA type.

Figure 5A:
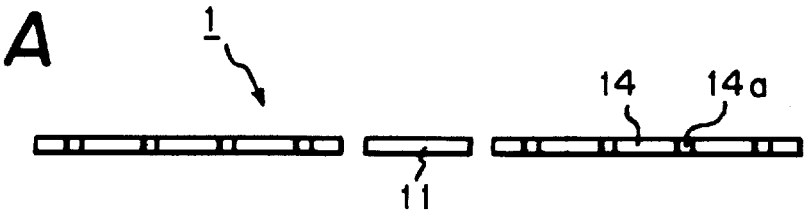
FIGS. 5A, 5B, 5C and 5D are cross-sectional views for explaining a first embodiment of the method for manufacturing a resin molded semiconductor device according to the present invention.

First, referring to FIG. 5A, a lead frame 1 as illustrated in FIG. 4 is prepared.

Figure 5B:
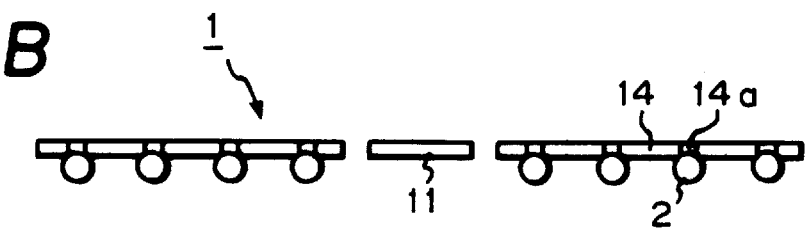

Next, referring to FIG. 5B, solder balls 2 are soldered at the throughholes 14a of the leads 14.

Figure 5C:
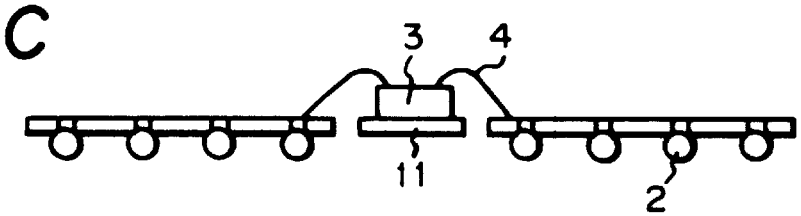

Next, referring to FIG. 5C, a semiconductor chip 3 is adhered to the island 11 of the lead frame 1. Then, bonding wire 4 is bonded between the bonding pads (not shown) of the semiconductor chip 3 and the tips of the leads 14.

Figure 5D:
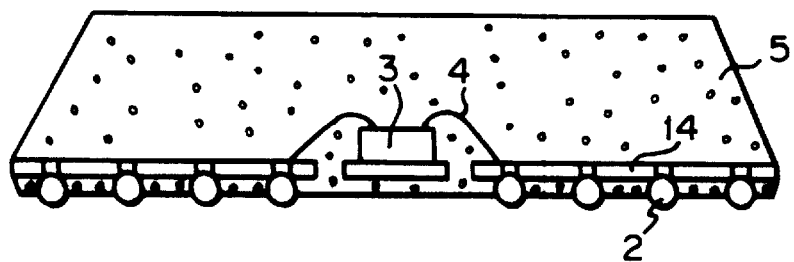

Finally, referring to FIG. 5D, the device of FIG. 5C is sandwiched by two metal molds (not shown). Then, hot resin is injected into a cavity between the metal molds. Then, the metal molds are removed, an envelope 5 made of resin encapsulates the semiconductor chip 3, the bonding wire 4 and the leads 14.

A second embodiment of the method for manufacturing a semiconductor device according to the present invention will be explained next with reference to FIGS. 6A, 6B, 6C and 6D. Note that this semiconductor device is of a PGA type.

Figure 6A:
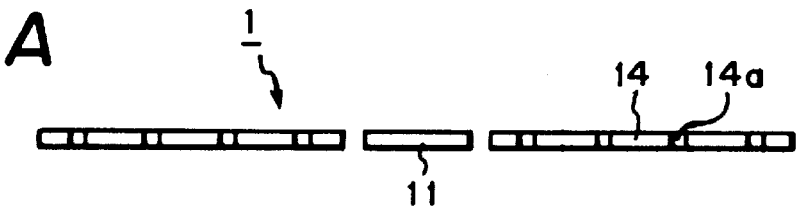
FIGS. 6A, 6B, 6C and 6D are cross-sectional views for explaining a second embodiment of the method for manufacturing a resin molded semiconductor device according to the present invention.

First, referring to FIG. 6A in the same way as in FIG. 5A, a lead frame 1 as illustrated in FIG. 4 is prepared.

Figure 6B:
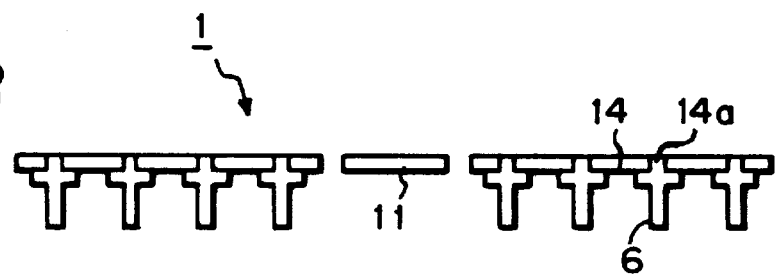

Next, referring to FIG. 6B, flanged pins 6 are soldered at the throughholes 14a of the leads 14.

Figure 6C:
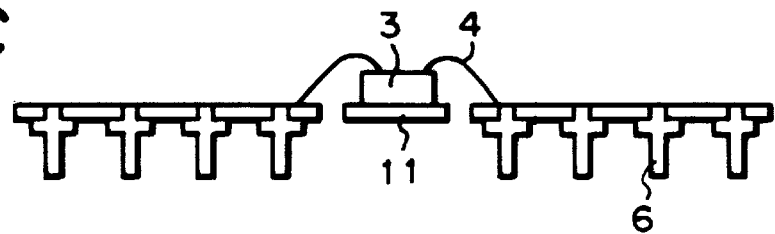

Next, referring to FIG. 6C, in the same way as in FIG. 5C, a semiconductor chip 3 is adhered to the island 11 of the lead 1. Then, bonding wire 4 is bonded between the bonding pads (not shown) of the semiconductor chip 3 and the tips of the leads 14.

Figure 6D:
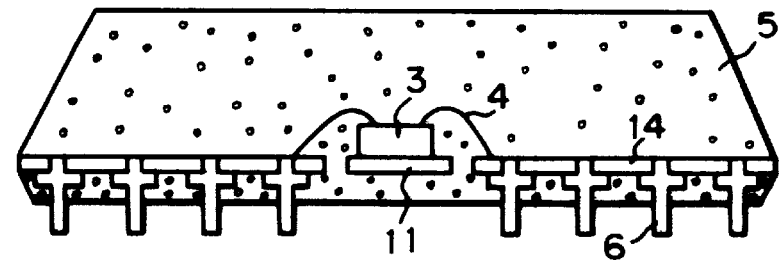

Finally, referring to FIG. 6D, in the same way as in FIG. 5D, the device of FIG. 6C is sandwiched by two metal molds (not shown). Then, hot resin is injected into a cavity between the metal molds. Then, the metal molds are removed, an envelope 5 made of resin encapsulates the semiconductor chip 3, the bonding wire 4 and the leads 14.

Figure 7:
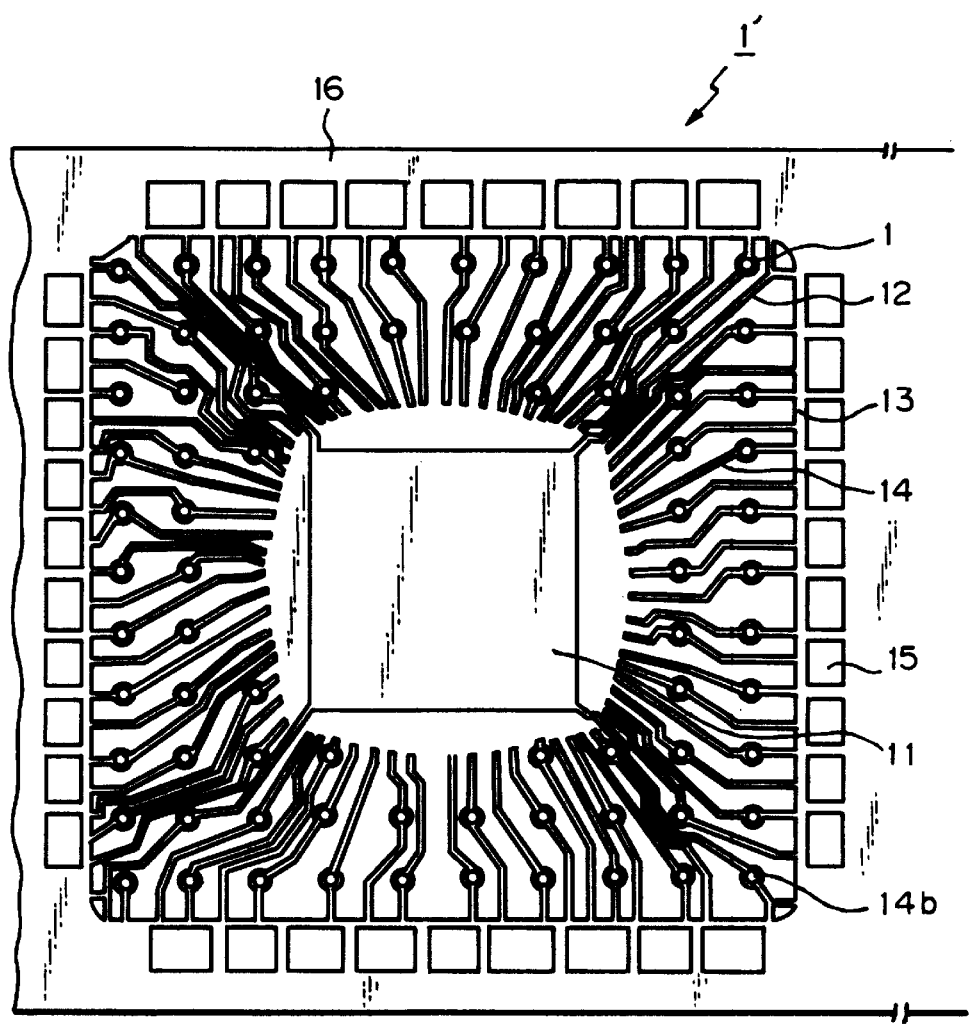
FIG. 7 is a plan view illustrating another lead frame according to the present invention.

In FIG. 7, which is a plan view illustrating another lead frame 1' according to the present invention, recess portions 14b instead of the throughholes 14a of FIG. 4 are provided on one side of bulged terminal portions of the leads 14. Note that protrusion portions 14c (see FIG. 8A) are formed on the other side of the recessed portions 14b of the leads 14.

A third embodiment of the method for manufacturing a semiconductor device according to the present invention will be explained next with reference to FIGS. 8A, 8B, 8C and 8D. Note that this semiconductor device is of a BGA type.

Figure 8A:
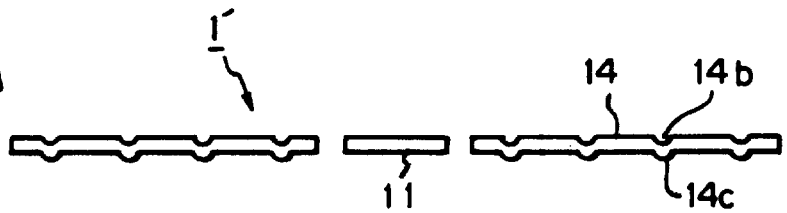
FIGS. 8A, 8B, 8C and 8D are cross-sectional views for explaining a third embodiment of the method for manufacturing a resin molded semiconductor device according to the present invention.

First, referring to FIG. 8A, a lead frame 1' as illustrated in FIG. 7 is prepared. In this case, the recess portions 14b are arranged upward, and therefore, the protrusion portions 14c are arranged downward.

Figure 8B:
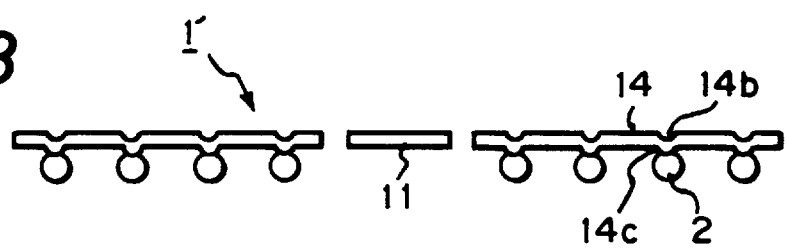

Next, referring to FIG. 8B, solder balls 2 are soldered at the protrusion portions 14c of the leads 14.

Figure 8C:
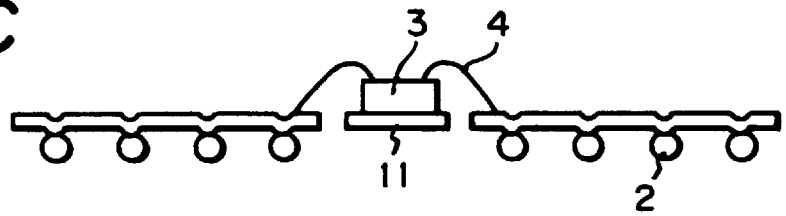

Next, referring to FIG. 8C, in the same way as in FIG. 5C, a semiconductor chip 3 is adhered to the island 11 of the lead 1. Then, bonding wire 4 is bonded between the bonding pads (not shown) of the semiconductor chip 3 and the tips of the leads 14.

Figure 8D:
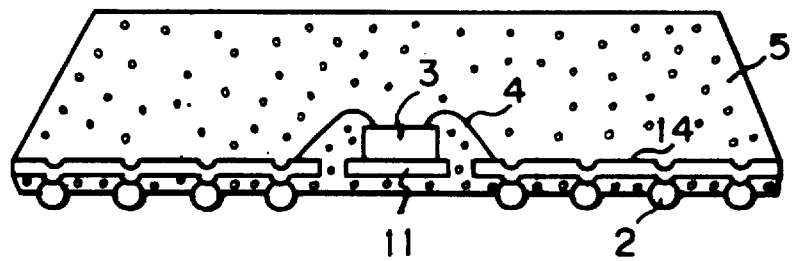

Finally, referring to FIG. 8D, in the same way as in FIG. 5D, the device of FIG. 8C is sandwiched by two metal molds (not shown). Then, hot resin is injected into a cavity between the metal molds. Then, the metal molds are removed, an envelope 5 made of resin encapsulates the semiconductor chip 3, the bonding wire 4 and the leads 14.

In the third embodiment, since the solder balls 2 are soldered at the protrusion portions 14c of the leads 14, the contact area therebetween is increased, so that the solder balls 2 are surely fixed to the leads 14.

A fourth embodiment of the method for manufacturing a semiconductor device according to the present invention will be explained next with reference to FIGS. 9A, 9B, 9C and 9D. Note that this semiconductor device is of a PGA type.

Figure 9A:
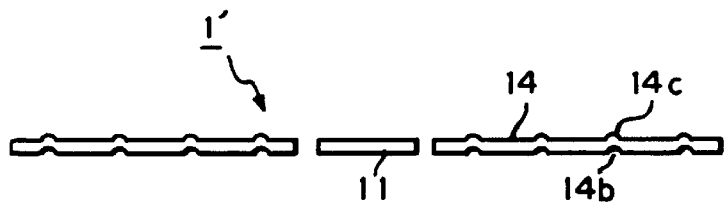
FIGS. 9A, 9B, 9C and 9D are cross-sectional views for explaining a fourth embodiment of the method for manufacturing a resin molded semiconductor device according to the present invention.

First, referring to FIG. 9A, a lead frame 1' as illustrated in FIG. 7 is prepared. In this case, the recess portions 14b are arranged downward, and therefore, the protrusion portions 14c are arranged upward.

Figure 9B:
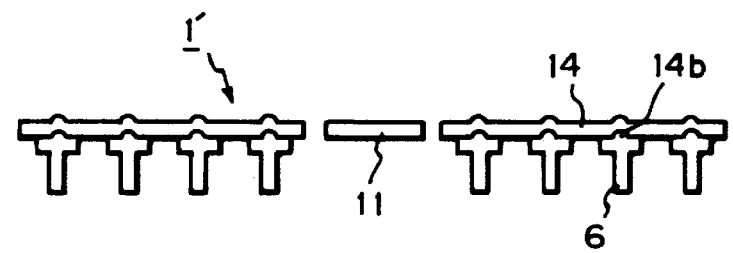

Next, referring to Fig. 9B, flanged pins 6 are soldered at the recess portions 14b of the leads 14.

Figure 9C:
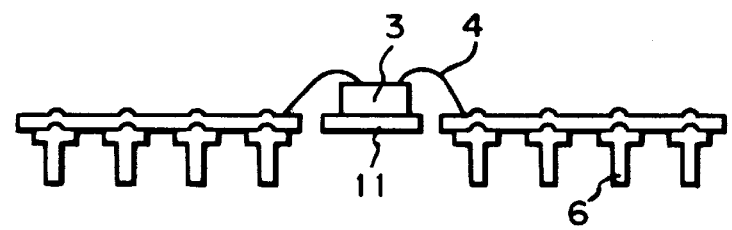

Next, referring to FIG. 9C, in the same way as in FIG. 8C, a semiconductor chip 3 is adhered to the island 11 of the lead 1. Then, bonding wire 4 is bonded between the bonding pads (not shown) of the semiconductor chip 3 and the tips of the leads 14.

Figure 9D:
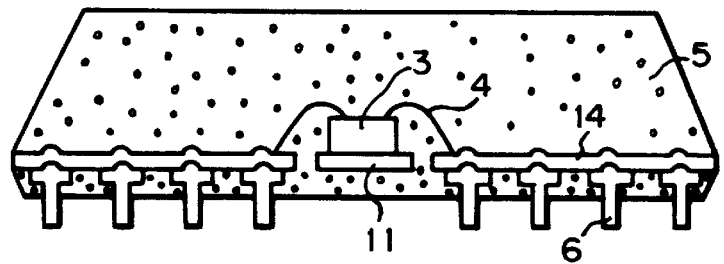

Finally, referring to FIG. 9D, in the same way as in FIG. 8D, the device of FIG. 9C is sandwiched by two metal molds (not shown). Then, hot resin is injected into a cavity between the metal molds. Then, the metal molds are removed, an envelope 5 made of resin encapsulates the semiconductor chip 3, the bonding wire 4 and the leads 14.

In the fourth embodiment, since the flanged pins 6 are soldered at the recess portions 14b of the leads 14, the contact area therebetween is increased, so that the flanged pins 6 are surely fixed to the leads 14.

Figure 10A:
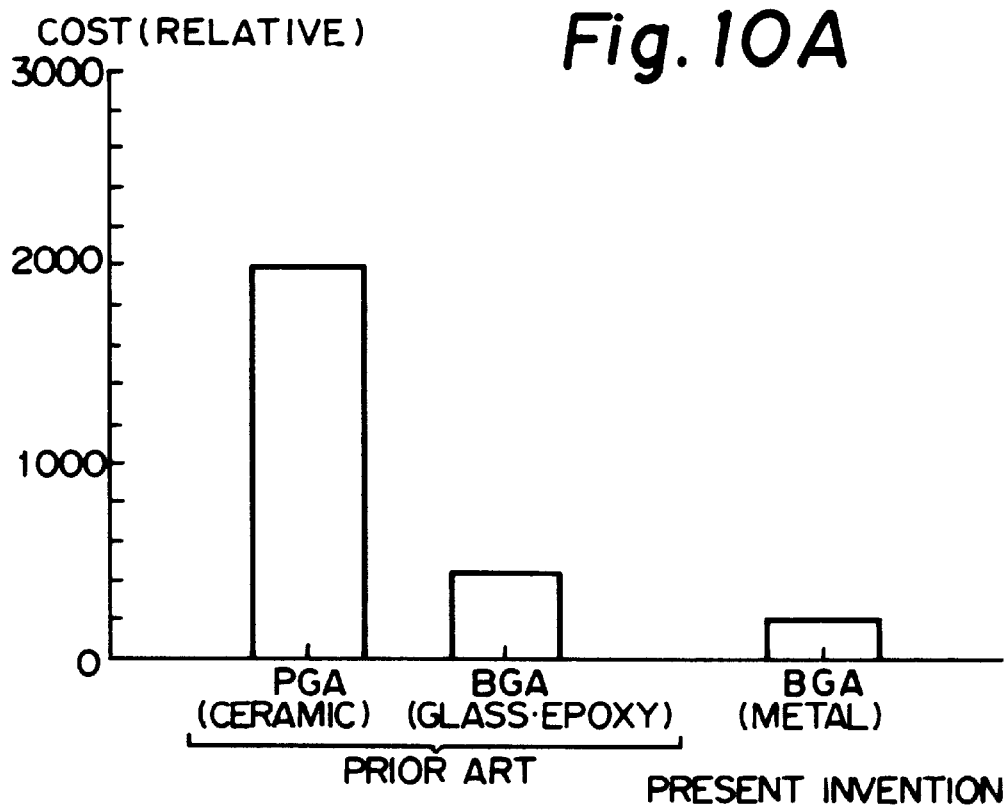
FIGS. 10A and 10B are graphs for showing the effect of the present invention and the prior art.
Figure 10B:
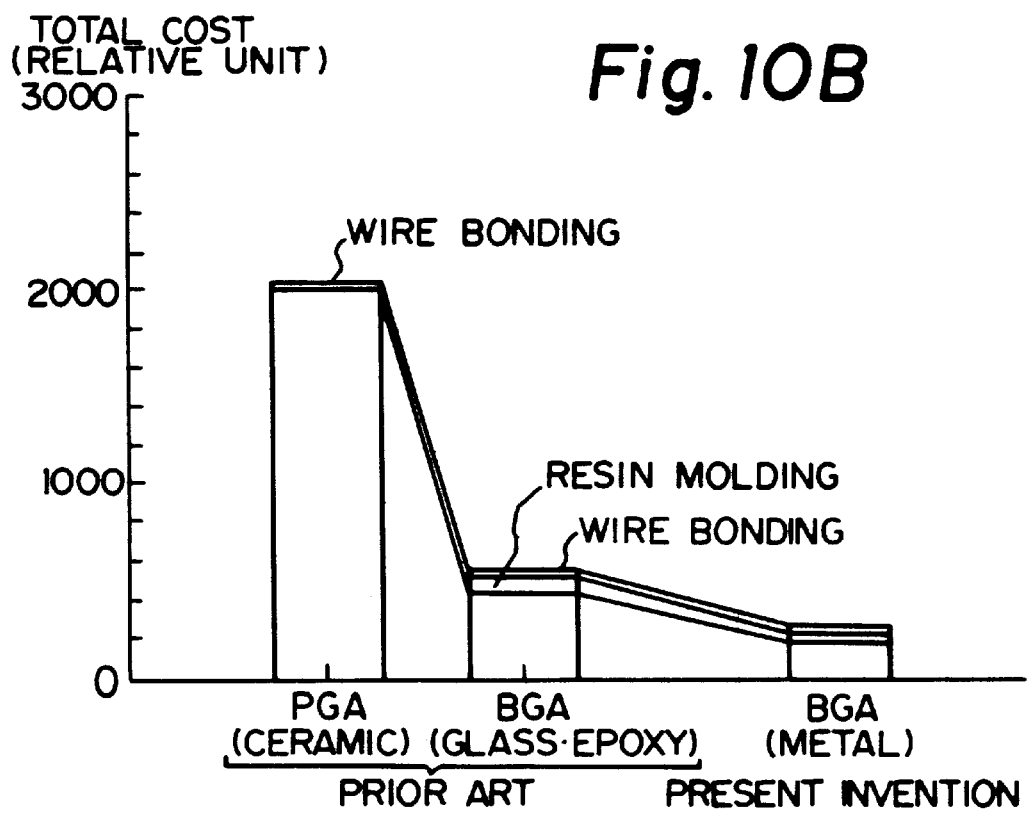

The semiconductor device according to the present invention can be remarkabley reduced in cost as compared with the prior art semiconductor devices, since the lead 1 or 1' is less expensive than the ceramic or glass-epoxy. That is, as shown in FIG. 10A, the cost of a ceramic substrate or a glass epoxy substrate used in the prior art is much higher than a metal lead frame used in the present invention. As a result, as shown FIG. 10B, the total cost of the semiconductor devices according to the present invention can be reduced as compared with those of the prior art.

As explained hereinabove, according to the present invention, since solder balls or flanged pins are connected directly to a metal lead frame which is inexpensive, the manufacturing cost can be reduced.

I claim:

1. A resin molded semiconductor device comprising:

a metal lead frame including an island and leads, said leads having bulged terminal portions;

a semiconductor chip mounted on said island;

external terminals adhered to said bulged terminal portions opposite to said semiconductor chip; and an envelope of resin for encapsulating said metal lead frame, said semiconductor chip and a part of each of said external terminals, wherein recess portions and protrusion portions each corresponding to one of said recess portions are formed in said bulged terminal portions.

2. The device as set forth in claim 1, wherein each of said external terminals comprises a solder ball in contact with one of said protrusion portions.

3. The device as set forth in claim 1, wherein each of said external terminals comprises a flanged pin in contact with one of said recess portions.

4. The device as set forth in claim 1, wherein said semiconductor chip is connected by bonding wire to said leads.

5. A resin molded semiconductor device comprising:

a metal lead frame including an island and leads, said leads having bulged terminal portions, recess portions and protrusion portions in combination being formed in said bulged terminal portions;

a semiconductor chip mounted on said island and connected by bonding wire to said leads;

solder balls adhered at said protrusion portions opposite to said semiconductor chip; and an envelope of resin for encapsulating said metal lead frame, said semiconductor chip and a part of each of said solder balls.

6. A resin molded semiconductor device comprising:

a metal lead frame including an island and leads, said leads having bulged terminal portions, recess portions and protrusion portions in combination being formed in said bulged terminal portions;

a semiconductor chip mounted on said island and connected by bonding wire to said leads;

flanged pins adhered at said recess portions opposite to said semiconductor chip; and an envelope of resin for encapsulating said metal lead frame, said semiconductor chip and a part of each of said flanged pins.

7. The metal lead frame used for a soldered semiconductor device, comprising:

an island for mounting a semiconductor chip;

suspenders, connected to said island, for supporting said island;

tie bars for avoiding resin leakage;

leads, connected to said tie bars; and a frame, connected to said suspenders, said tie bars and said leads, said leads having bulged terminal portions, wherein recess portions and protrusion portions are formed in said bulged terminal portions.

* * * * *